(12) United States Patent
Michaelson et al.

(10) Patent No.: US 7,422,979 B2
(45) Date of Patent: Sep. 9, 2008

(54) METHOD OF FORMING A SEMICONDUCTOR DEVICE HAVING A DIFFUSION BARRIER STACK AND STRUCTURE THEREOF

(75) Inventors: Lynne M. Michaelson, Austin, TX (US); Edward Acosta, Martindale, TX (US); Ritwik Chatterjee, Austin, TX (US); Stanley M. Filipiak, Pflugerville, TX (US); Sam S. Garcia, Austin, TX (US); Varughese Mathew, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 36 days.

(21) Appl. No.: 11/078,236

(22) Filed: Mar. 11, 2005

(65) Prior Publication Data
US 2006/0202339 A1 Sep. 14, 2006

(51) Int. Cl.
*H01L 21/4763* (2006.01)
*H01L 21/44* (2006.01)

(52) U.S. Cl. .................. 438/643; 438/653; 438/656; 438/685; 438/687; 257/762; 257/E23.145

(58) Field of Classification Search ............... 438/643, 438/653, 687, 656, 685; 257/758, 774, 762, 257/E23.145
See application file for complete search history.

(56) References Cited

U.S. PATENT DOCUMENTS

| | | | |
|---|---|---|---|
| 6,218,302 B1* | 4/2001 | Braeckelmann et al. ..... | 438/687 |
| 6,342,733 B1 | 1/2002 | Hu et al. | |
| 6,358,832 B1 | 3/2002 | Edelstein et al. | |
| 6,573,179 B1 | 6/2003 | Wang et al. | |
| 6,573,606 B2* | 6/2003 | Sambucetti et al. ......... | 257/762 |
| 6,605,874 B2 | 8/2003 | Leu et al. | |
| 6,962,873 B1* | 11/2005 | Park ........................... | 438/627 |
| 6,975,033 B2* | 12/2005 | Ito et al. ...................... | 257/761 |
| 2001/0030366 A1* | 10/2001 | Nakano et al. ............... | 257/758 |
| 2003/0148618 A1 | 8/2003 | Parikh | |
| 2004/0026786 A1 | 2/2004 | Leu et al. | |
| 2004/0048468 A1* | 3/2004 | Liu et al. ...................... | 438/687 |
| 2004/0084773 A1* | 5/2004 | Johnston et al. ............ | 257/751 |
| 2004/0248409 A1* | 12/2004 | Padhi et al. ................. | 438/653 |
| 2006/0170106 A1* | 8/2006 | Tseng et al. ................. | 257/760 |

OTHER PUBLICATIONS

Ishigami, T. et al.; "High Reliability Cu Interconnection Utilizing a Low Contamination CoWP Capping Layer"; IEEE; 2004; pp. 75-77; USA.

(Continued)

*Primary Examiner*—Nitin Parekh
(74) *Attorney, Agent, or Firm*—David G. Dolezal; Kim-Marie Vo

(57) ABSTRACT

A diffusion barrier stack is formed by forming a layer comprising a metal over a conductor that includes copper; and forming a first dielectric layer over the layer, wherein the dielectric layer is of a thickness that alone it can not serve as a diffusion barrier layer to the conductor and the first dielectric layer prevents oxidation of the layer. In one embodiment, the diffusion barrier stack includes two layers; the first layer is a conductive layer and the second layer is a dielectric layer. The diffusion barrier stack minimizes electromigration and copper diffusion from the conductor.

10 Claims, 2 Drawing Sheets

OTHER PUBLICATIONS

Hu, C.-K, et al.; "Comparison of Cu electromigration lifetime in Cu interconnects coated with various caps"; Applied Physics Letters; Jul. 28, 2003; pp. 1-3; vol. 83, No. 4; American Institute of Physics; USA.

Hu, C.-K et al.; "Reduced electromigration of Cu wires by surface coating"; Applied Physics Letters; Sep. 2, 2002; pp. 1782-1784; vol. 81; No. 10; American Institute of Physics; USA.

Itabashi, Takeyuki et al.; Electroless Deposited CoWB for Copper Diffusion Barrier Metal; 2002; pp. 285-287; IEEE; USA.

* cited by examiner

METHOD OF FORMING A SEMICONDUCTOR DEVICE HAVING A DIFFUSION BARRIER STACK AND STRUCTURE THEREOF

FIELD OF THE INVENTION

This invention relates generally to semiconductor devices, and more specifically, to semiconductor having a diffusion barrier stack.

BACKGROUND

Lower capacitance is desired for copper interconnects to improve the performance of semiconductor devices. One solution involves using dielectrics with low dielectric constant (k) values in the interconnect stacks. Another solution involves reducing the thickness of any higher k material in the interconnect stack. Typically, the material with the highest k value is the barrier layer that functions as an etch stop and copper diffusion barrier. It is desirable to reduce this barrier layer thickness or replace the higher k value material with a lower k material, such as SiCN, while maintaining copper diffusion barrier properties. However, electromigration may be worse when a lower k material is used as the barrier layer. One solution is to increase the thickness of the lower k material so that electromigration is improved, however the thickness that would be needed (35 to 50 nm) would undesirably increase the overall capacitance of the dielectric stack resulting in decreased performance. Thus, a need exists for a barrier that has a low-k value and prevents electromigration failure.

BRIEF DESCRIPTION OF THE DRAWINGS

The present invention is illustrated by way of example and is not limited by the accompanying figures, in which like references indicate similar elements.

Figure 1:
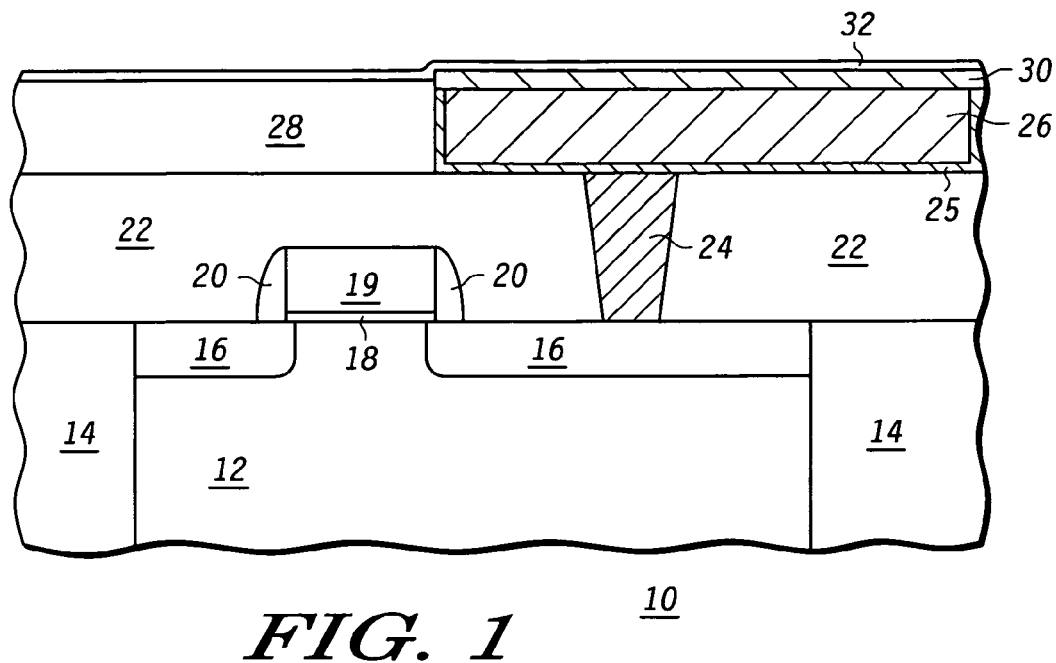
FIG. 1 illustrates a cross-sectional view of a portion of a workpiece after forming a first conductor, a first interlevel dielectric layer, and a first barrier stack in accordance with an embodiment of the present invention.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

In one embodiment a two layer copper diffusion barrier is formed in which the top layer is an oxygen-free thin dielectric (e.g., 2-20 nm) and the bottom layer is a thin conductive film (e.g., 5-20 nm) selectively grown on the underlying copper interconnect. Neither layer is able to function as a copper diffusion barrier alone; however, when combined the stack provides the same effectiveness for preventing copper diffusion as the traditional thick dielectric diffusion barrier films, which are approximately 35 to 50 nm thick. For example, the copper diffusion barrier may be 5 nm of SiCN formed over 17 nm of CoWB.

In one embodiment, a method of forming a semiconductor device, the method includes providing a semiconductor substrate, forming a conductor over the semiconductor substrate, wherein the conductor includes copper, and forming a diffusion barrier stack over the conductor, wherein the diffusion barrier stack includes forming a layer including a metal over the conductor; and forming a first dielectric layer substantially devoid of oxygen over the layer, wherein the dielectric layer is of a thickness that alone it can not serve as a diffusion barrier layer to the conductor. In one embodiment, forming the layer further includes selectively depositing the layer. In one embodiment, the method further includes forming a second dielectric layer over the diffusion barrier stack. In one embodiment, forming the first dielectric layer further includes forming a first dielectric layer having a thickness less than 20 nanometers. In one embodiment, the first dielectric layer includes an element selected from the group consisting of silicon, nitrogen and carbon. In one embodiment, the layer includes an element selected from the group consisting of cobalt, nickel, tungsten, rhenium, molybdenum, phosphorus and boron. In one embodiment, the dielectric layer has dielectric constant that is less than the dielectric constant of stoichiometric silicon nitride. In one embodiment, the method further includes removing at least a portion of the diffusion barrier stack.

In one embodiment, a method of forming a semiconductor device, the method includes providing a semiconductor substrate; forming a first dielectric layer over the semiconductor substrate; patterning the first dielectric layer to form a first opening; forming a conductor in the first opening, wherein the conductor includes copper; forming an electromigration reduction layer over the conductor; and forming a second dielectric layer over the electromigration reduction layer and the first dielectric layer, wherein the second dielectric layer prevents oxidation of the electromigration reduction layer and is thin. In one embodiment, the method also includes removing a portion of the second dielectric layer to form a second opening; and forming a via over the conductor in the second opening. In one embodiment, the method also includes removing a portion of the electromigration reduction layer. In one embodiment, forming the electromigration reduction layer further includes selectively depositing the layer. In one embodiment, the method further includes forming a second dielectric layer over the diffusion barrier stack. In one embodiment, forming the first dielectric layer further includes forming a first dielectric layer having a thickness less than 20 nanometers. In one embodiment, the first dielectric layer includes an element selected from the group consisting of silicon, nitrogen and carbon. In one embodiment, the layer includes an element selected from the group consisting of cobalt, nickel, tungsten, rhenium, molybdenum, phosphorus and boron. In one embodiment, the dielectric layer has dielectric constant that is less than the dielectric constant of stoichiometric silicon nitride.

In one embodiment, a semiconductor device includes a semiconductor substrate; a conductor over the semiconductor substrate, wherein the conductor includes copper; a diffusion barrier stack over at least a portion of the conductor, wherein the diffusion barrier stack includes a layer including a metal over the conductor; and a thin dielectric layer devoid of oxygen over the layer. In one embodiment, the thin dielectric layer has a thickness less than 20 nanometers.

FIG. 1 illustrates a cross-section of a portion of a workpiece 10 having a transistor and interconnects. The workpiece 10 includes a semiconductor substrate 12 with isolation regions 14. The semiconductor substrate 12 can be any semiconductor material or combinations of materials, such as gallium arsenide, silicon germanium, silicon-on-insulator (SOI) (e.g., fully depleted SOI (FDSOI)), silicon, monocrystalline silicon, the like, and combinations of the above. The isolation regions 14 can be formed by any method, but are most likely formed by thermal oxidation of the semiconductor substrate 12. The area of the semiconductor substrate 12 between the isolation regions 14 is the active area, which is where a transistor is formed. The transistor shown in FIG. 1 is just one embodiment of a semiconductor device formed on the substrate. Another type of semiconductor device (e.g., a non-volatile memory (NVM) device) may be formed.

In the embodiment shown, the transistor includes source/drain regions 16, gate dielectric 18, gate electrode 19, and spacers 20. While one embodiment of forming the shown transistor will be described, any other processes may be used. To form the gate dielectric 18 a gate dielectric layer may be formed by thermal growth, deposition (e.g., chemical vapor deposition (CVD), atomic layer deposition (AID), physical vapor deposition (PVD)), the like, or combinations of the above. Any suitable dielectric can be used for the gate dielectric layer, such as silicon dioxide, a high-dielectric constant material (high-k), such as hafnium oxide, the like or combinations of the above. Next, a gate electrode layer may be formed over the gate dielectric layer by CVD, ALD, PVD, the like and combinations of the above. The gate electrode layer may be any suitable material, such as polysilicon, a metal electrode, such as TaN, TaCN, the like and combinations of the above. After forming the gate electrode layer, the gate electrode layer and the gate dielectric layer may be patterned using conventional processing to form the gate electrode 19 and the gate dielectric 18. Next, the source/drain regions 16 may be formed by ion implantation. Then, spacers 20 may be formed by depositing a dielectric, such as silicon nitride, and anisotropically etching the dielectric. Subsequent ion implantation may occur to form addition regions of the source/drain regions 16. In addition, additional spacers may be formed.

After forming the transistor, a contact 24 may be formed to conductive region of the transistor, such as the source/drain region 16. While not illustrated in the cross-section of FIG. 1 a contact is also made to the gate electrode 19. In one embodiment, the contact 24 is formed by depositing a first interlevel dielectric layer 22 over the workpiece 10, etching openings in the first interlevel dielectric layer 22, and filling the openings with a conductive material, such as tungsten. The conductive material can be formed in the openings by CVD, ALD, PVD, electroplating, the like, and combinations of the above. The first interlevel dielectric layer 22 (and all interlevel dielectric layers formed) may be approximately 350 nm of silicon dioxide formed from tetraethyorthosilane (TEOS). In a preferred embodiment, all interlevel dielectric layers formed are a dielectric having a low dielectric constant, such as SiCOH. The first interlevel dielectric layer 22 may be any dielectric layer but preferably has a low dielectric constant.

After forming the contact 24, a first conductor 26 can be formed. To form the first conductor 26, a second interlevel dielectric layer 28 is formed over the workpiece 10 and etched to form openings. The second interlevel dielectric layer 28 may be any dielectric layer but is preferably has a low dielectric constant. Within the openings a first liner layer 25 is deposited by CVD, ALD, PVD, electroplating, the like, and combinations of the above. The first liner layer 25 is used to prevent elements from the first conductor 26 from diffusing into the second interlevel dielectric layer 28. In one embodiment, the first liner layer 25 is approximately 30 nm of tantalum, tantalum nitride, or the like. After forming the first liner layer 25, the conductor material is deposited by CVD, ALD, PVD, electroplating, the like, and combinations of the above in the opening within the second interlevel dielectric layer 28. In one embodiment, the conductor material includes copper and is copper or a copper alloy, such as CuSn. In one embodiment, more of the conductor material than needed is deposited so that the conductor material not only fills the opening but extends higher than the opening and is formed over the second interlevel dielectric. If this occurs, a chemical mechanical polishing (CMP) process may be performed to remove any of the conductor material that lies outside the opening. If a CMP process is performed, the conductor 26 may dish so that the top of the conductor 26 is not contiguous with the top of the second interlevel dielectric layer 28, as shown in FIG. 1. An etch back may also be used.

After forming the first conductor 26, a diffusion barrier stack is formed over the conductor 26. The diffusion barrier stack includes two layers: a conductive layer 30 and a first dielectric layer 32. The first conductive layer 30 can be considered an electromigration reduction layer because it helps decrease electromigration of the first conductor 26. It is believed that electromigration is decreased due to the first conductive layer 30 and the first conductor 26 having good adhesion to each other. In other words in one embodiment, the first conductive layer 30 adheres better to the first conductor 26 than the fist dielectric layer 32 does. The first conductive layer 30 does not serve as a suitable diffusion layer without the first dielectric layer 32. Similarly, although the material used for the first dielectric layer 32 is a suitable dielectric layer if it is thick enough, it is desirable to make the first dielectric layer 32 thin so that it does not minimize its impact on increasing the effective capacitance of the interlevel dielectric layer stack that is being formed.

In one embodiment, the first conductive layer 30 is formed by any deposition process, such as CVD, ALD, PVD, electroplating, the like and combinations of the above. Preferably, the conductive layer 30 is performed by selective deposition so that it is only formed on the first conductor 26. If instead, the deposition process is not selective a subsequent patterning step is needed to remove the first conductive layer 30 from the areas overlying the second interlevel dielectric layer 28 so as to avoid the first conductor from being undesirably electrically coupled to other conductors (not shown) by the first conductive layer 30. In one embodiment, the first conductive layer 30 is 5 to 20 nm thick or more preferably less than 30 nm thick. If the first conductive layer 30 is greater than or equal to 30 nm thick it is believed that it may act as a suitable diffusion barrier alone, but that it will cause leakage between the conductors. In one embodiment, the first conductive layer 30 includes Co or Ni with W, Re, Mo, P, or B. Thus, for example, the first conductive layer 30 may be CoWP, CoWB, CoWPB, CoReP, CoReB, CoRePB, CoMoP, CoMoB, CoMoPB, NiWP, NiWB, NiWPB, NiReP, NiReB, NiRePB, NiMoP, NiMoB, NiMoPB, etc. The phosphorus and boron is likely to be a part of the first conductive layer 30 if the conductive layer 30 is formed by plating as these elements come from the plating baths used. Other conductive materials, such as W or WN that can meet the diffusion and electromigration needs may also be used. It is preferable that the conductive material is able to be formed selectively.

In one embodiment, CoWB is formed selectively by electroless plating. A bath including cobalt salts, chelating agents, pH adjusters, buffers, surfactants, and reducing agents can be used.

After forming the first conductive layer 30, the first dielectric layer 32 is formed. The first dielectric layer 32 is less than 30 nm, or more preferably less than 20 nanometers, or more preferably less than 10 nm, or more preferably between 5 to 10 nm, or more preferably between 2 to 10 nm. The first dielectric layer 32 may be formed by CVD, ALD, PECVD, and the like or combinations of the above. The material chosen for the dielectric layer 32 prevents rapid oxidation of the underlying conductive layer 30 so that when exposed to oxygen the dielectric layer 32 does not change its composition and allow for oxidation of the underlying conductive layer 30. Thus, the dielectric layer 32 does not intentionally include oxygen. Oxygen is not intentionally put in the dielectric layer 32, but it may become part of the dielectric layer 32 depending on the condition of the chamber used to form the dielectric layer 32. In one embodiment, the first dielectric layer 32 includes a dielectric that is substantially devoid of oxygen but includes silicon and nitrogen, such as SiN and SiCN. In one embodiment, the first dielectric layer 32 is substantially devoid of oxygen and includes 0 to 20% or more specifically from 0.25% to 20% of oxygen. In one embodiment, the conductive layer 30 is treated to an in-situ plasma including ammonia, which may also include a nitrogen gas, prior to forming the SiCN by plasma enhanced chemical vapor deposition (PECVD); a skilled artisan recognized that SiCN includes hydrogen when formed by PECVD, but regardless the material is referred to as SiCN. The first dielectric layer 32 may also be silicon carbide or silicon carbide nitride. In addition, the first dielectric layer 32 may be the first portion of a bulk dielectric that includes oxygen but is graded so that the first portion has a significantly lower oxygen concentration than the bulk dielectric; for example, the layer can be a graded layer of the interlevel dielectric, which may be SiCOH. In one embodiment, the significantly lower oxygen concentration is between 0 to 20% or more preferably between 0.25% to 20% of oxygen and the percent oxygen may increase to approximately 62 in the graded bulk dielectric.

As shown in FIG. 1, when forming the first dielectric layer 32 it is formed over the entire workpiece 10 (i.e., it is not formed selectively). Since the first dielectric layer 32 is a dielectric and will not couple the conductor 26 to another one, it does not need to be removed from the areas above the second interlevel dielectric layer 28. However, to avoid substantially increasing the effective capacitance of the stack comprised of dielectric layers, the material and thickness chosen for the dielectric layer 32 preferably has a dielectric constant less than that of stoichiometric silicon nitride. The resulting capacitance is a function of the dielectric constant of a material itself and the thickness of the material.

Figure 2:
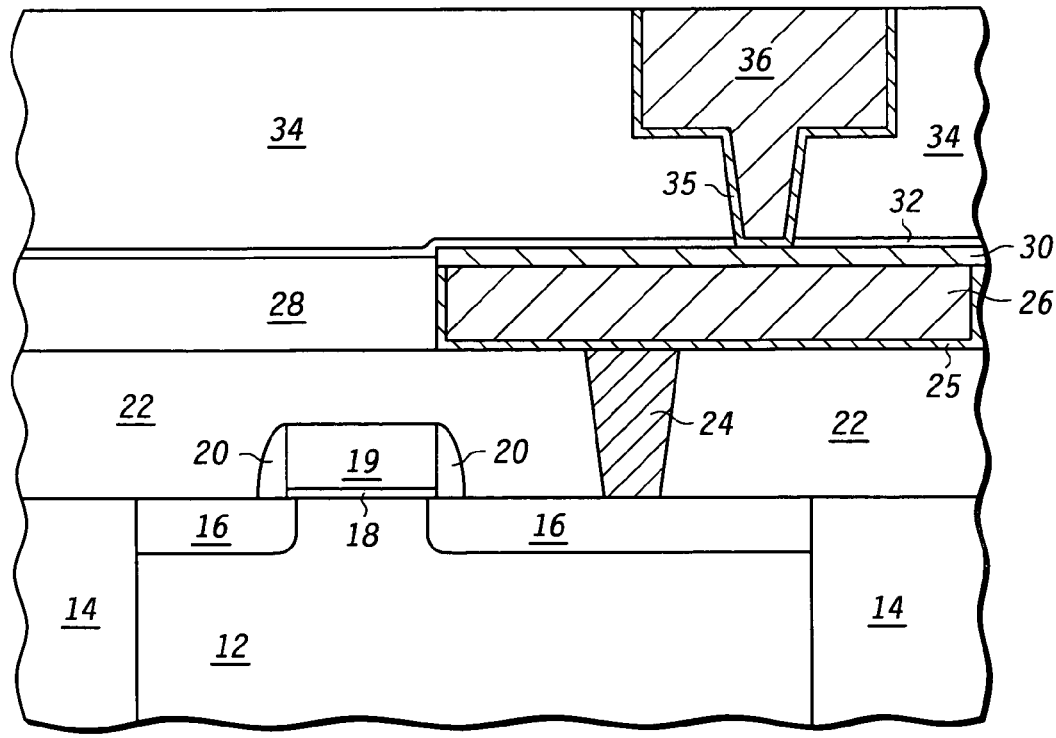
FIG. 2 illustrates the workpiece of FIG. 1 after patterning the first interlevel dielectric layer and the first barrier stack and forming a second conductor.

As shown in FIG. 2, after forming the diffusion barrier stack, a second conductor 36 is formed over the first conductor 26. FIG. 2 illustrates a dual inlaid approach to forming the second conductor 36. After forming the diffusion barrier stack, a lower portion of the third interlevel dielectric layer 34 is formed over the workpiece 10. A via opening is etched into the lower portion of the third interlevel dielectric layer 34 and an opening in the first dielectric layer 32 is formed. At least a portion of the first dielectric layer 32 is removed so that subsequently formed conductors are electrically coupled to the conductor 26. While not illustrated, the portion of the first conductive layer 30 that underlies the removed portion of the first dielectric layer 32 may also be removed. Next, an upper portion of the third interlevel dielectric layer 34 is formed over the workpiece 10. (Although not shown, additional layers, such as etch stop layers, may lie between the upper and lower portions of the interlevel dielectric layer 34.) A trench opening is formed in the upper layer of the third interlevel dielectric layer 34. Next, a second linear layer 35, which may be any of the materials and formed by any of the methods of the first liner layer 25, is formed within the via and the trench openings. The via and trench openings are then filled with a second conductor 26, which may be any of the materials and formed by any of the methods as the first conductor 26.

Figure 3:
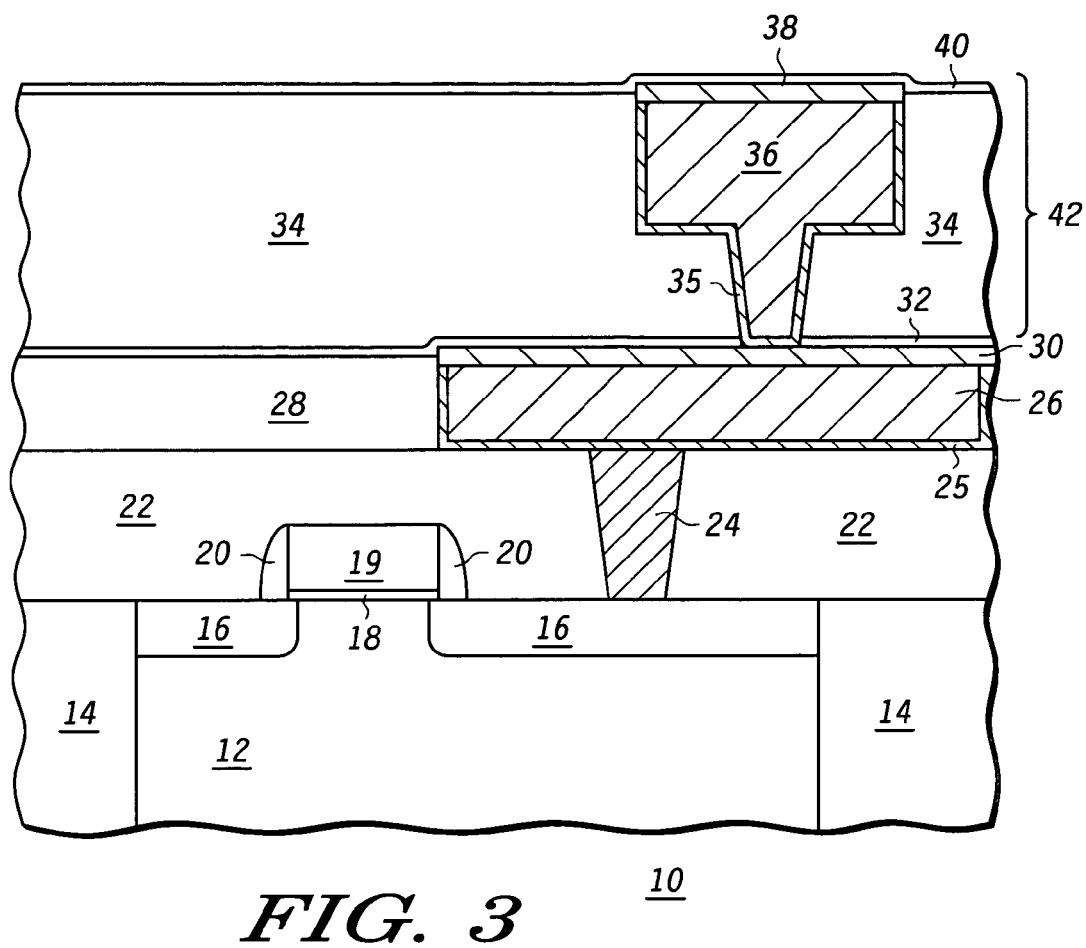
FIG. 3 illustrates the workpiece of FIG. 2 after forming a second barrier stack.

As shown in FIG. 3 after forming the second conductor 36, a second diffusion barrier stack is formed. The second diffusion barrier stack includes a second conductive layer 38 and the second dielectric layer 40. The second conductive layer 38 and the second dielectric layer 40 can be any of the materials of the first conductive layer 30 and the first dielectric layer 32. In addition, the same processes can be used to form the second conductive layer 38 and the second dielectric layer 40 as was used to form the first conductive layer 30 and the first dielectric layer 32. However, the materials and processes need not be the same.

After forming the second diffusion barrier stack, structure 42, which includes the third interlevel dielectric layer 34, the second liner layer 35, the second conductor 36, the second conductive layer 38, and the second dielectric layer 40 may be repeated as desired. For example, if the number of conductor layers (metallization or interconnect layers) is to be five, there should be 4 of the structures 42 because the conductor 26 is also one of the conductor layers. Thus, there are n–1 structures 42, where n is the number of interconnect layers. After the last structure 42 is performed conventional processing may be used to form bond pads and package the device.

By now it should be appreciated that there has been provided a diffusion barrier stack to prevent copper diffusion without significantly impacting the capacitance of a device. A single thin conductive diffusion barrier layer will not serve as a suitable copper diffusion barrier and a thick layer will cause an increase leakage current between conductors. This decrease is capacitance will improve the speed performance for the conductor without degrading reliability. In addition, superior electromigration performance is achieved compared to prior art methods. Because the diffusion barrier stack includes two layers the requirements for each layer is relaxed enabling a larger range of material choices than only a single layer was used as to prevent/minimize diffusion.

In the foregoing specification, the invention has been described with reference to specific embodiments. However, one of ordinary skill in the art appreciates that various modifications and changes can be made without departing from the scope of the present invention as set forth in the claims below. Although the figures illustrated a dual-inlaid approach, the diffusion barrier stack can be used for a single-inlaid approach. In addition, the diffusion barrier stack need not be formed on all conductors; instead, it may be used only on some conductors. Accordingly, the specification and figures are to be regarded in an illustrative rather than a restrictive sense, and all such modifications are intended to be included within the scope of the present invention.

Moreover, the terms "front", "back", "top", "bottom", "over", "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms "a" or "an", as used herein, are defined as one or more than one. The term "coupled", as used herein, is defined as connected, although not necessarily directly, and not necessarily mechanically.

What is claimed is:

1. A method of forming a semiconductor device, the method comprising steps of:
   providing a semiconductor substrate;
   forming a conductor over the semiconductor substrate, wherein the conductor comprises copper;
   forming a diffusion barrier stack over the conductor, wherein forming the diffusion barrier stack comprises:
      forming a layer comprising a metal over the conductor, wherein the layer comprises a first element, a second element, and a third element, wherein:
         the first element is cobalt (Co) or nickel (Ni)
         the second element is tungsten (W), rhenium (Re) or molybdenum (Mo), and
         the third element is boron (B) or phosphorous (P);
         forming a first dielectric layer substantially devoid of oxygen over the layer, wherein forming the first dielectric layer further comprises forming a first dielectric layer having a thickness less than 20 nanometers, wherein the first dielectric layer has dielectric constant that is less than the dielectric constant of stoichiometric silicon nitride, and wherein:
            when forming the first dielectric layer, the layer comprising the metal has a substantially uniform thickness between the conductor and the first dielectric layer; and
            the first dielectric layer is of a thickness that alone it can not serve as a diffusion barrier layer to the conductor; and
   forming a second dielectric layer over the diffusion barrier stack, wherein the second dielectric layer includes silicon carbide nitride (SiCN).

2. The method of claim 1, wherein forming the layer, further comprises selectively depositing the layer.

3. The method of claim 1, wherein the first dielectric layer comprises an element selected from the group consisting of silicon, nitrogen and carbon.

4. The method of claim 1, further comprising removing at least a portion of the diffusion barrier stack.

5. A method of forming a semiconductor device, the method comprising steps of:
   providing a semiconductor substrate;
   forming a first dielectric layer over the semiconductor substrate, wherein forming the first dielectric layer further comprises forming a first dielectric layer having a thickness less than 20 nanometers, and wherein the first dielectric layer has dielectric constant that is less than the dielectric constant of stoichiometric silicon nitride;
   patterning the first dielectric layer to form a first opening having a sidewall;
   forming a conductor material in the first opening, wherein the conductor comprises copper;
   polishing the conductor material to form a conductor, wherein an uppermost point of the side of the conductor lies at substantially the same elevation as an uppermost point of the conductor;
   forming an electromigration reduction layer over the conductor, wherein the
   electromigration reduction layer includes a first element, a second element, and a third element, wherein:
      the first element is cobalt (Co) or nickel (Ni);
      the second element is tungsten (W), rhenium (Re) or molybdenum (Mo), and
      the third element is boron (B) or phosphorous (P); and
   forming a second dielectric layer over the electromigration reduction layer and the first dielectric layer, wherein the second dielectric layer includes silicon carbide nitride (SiCN).

6. The method of claim 5, further comprising
   removing a portion of the second dielectric layer to form a second opening; and
   forming a via over the conductor in the second opening.

7. The method of claim 6, further comprising removing a portion of the electromigration reduction layer.

8. The method of claim 5, wherein forming the electromigration reduction layer, further comprises selectively depositing the layer.

9. The method of claim 5, further comprising forming a second dielectric layer over the diffusion barrier stack.

10. The method of claim 5, wherein the first dielectric layer comprises an element selected from the group consisting of silicon, nitrogen and carbon.

* * * * *